(12) United States Patent
Tang et al.

(10) Patent No.: US 10,535,554 B2
(45) Date of Patent: Jan. 14, 2020

(54) SEMICONDUCTOR DIE HAVING EDGE WITH MULTIPLE GRADIENTS AND METHOD FOR FORMING THE SAME

(71) Applicant: Taiwan Semiconductor Manufacturing Co., Ltd., Hsinchu (TW)

(72) Inventors: Yu-Sheng Tang, Hsinchu (TW); Fu-Chen Chang, Hsinchu (TW); Cheng-Lin Huang, Hsinchu (TW); Chun-Yen Lo, Hsinchu (TW); Wen-Ming Chen, Zhunan Township, Miaoli County (TW); Kuo-Chio Liu, Hsinchu (TW)

(73) Assignee: TAIWAN SEMICONDUCTOR MANUFACTURING CO., LTD., Hsinchu, Taiwan (CN)

( * ) Notice: Subject to any disclaimer, the term of this patent is extended or adjusted under 35 U.S.C. 154(b) by 0 days.

(21) Appl. No.: 15/725,558

(22) Filed: Oct. 5, 2017

(65) Prior Publication Data
US 2018/0166328 A1    Jun. 14, 2018

Related U.S. Application Data

(60) Provisional application No. 62/433,856, filed on Dec. 14, 2016.

(51) Int. Cl.
| H01L 23/495 | (2006.01) |
| H01L 23/522 | (2006.01) |
| H01L 21/304 | (2006.01) |
| H01L 21/56 | (2006.01) |
| H01L 21/768 | (2006.01) |

(Continued)

(52) U.S. Cl.
CPC ...... *H01L 21/76802* (2013.01); *H01L 21/304* (2013.01); *H01L 21/3043* (2013.01);
(Continued)

(58) Field of Classification Search
CPC ............. H01L 21/6835; H01L 21/6836; H01L 23/3114; H01L 23/3157; H01L 23/3185; H01L 24/27; H01L 24/12; H01L 2221/68327; H01L 2221/68377; H01L 2224/16; H01L 2224/274;
(Continued)

(56) References Cited

U.S. PATENT DOCUMENTS 7,265,034 B2    9/2007  Lu et al.
8,058,151 B2    11/2011  Jeng et al.
(Continued)

*Primary Examiner* — Brian Turner
(74) *Attorney, Agent, or Firm* — McClure, Qualey & Rodack, LLP

(57) ABSTRACT

A method for sawing a semiconductor wafer is provided. The method includes sawing a semiconductor wafer to form a first opening. In addition, the semiconductor wafer includes a dicing tape and a substrate attached to the dicing tape by a die attach film (DAF), and the first opening is formed in an upper portion of the substrate. The method further includes sawing through the substrate and the DAF of the semiconductor wafer from the first opening to form a middle opening under the first opening and a second opening under the middle opening, so that the semiconductor wafer is divided into two dies. In addition, a slope of a sidewall of the middle opening is different from slopes of sidewalls of the first opening and the second opening.

20 Claims, 18 Drawing Sheets

(51) Int. Cl.
*H01L 21/683* (2006.01)
*H01L 21/67* (2006.01)
*H01L 23/00* (2006.01)
*H01L 23/48* (2006.01)
*H01L 21/78* (2006.01)
*H01L 23/498* (2006.01)
*H01L 25/10* (2006.01)
*H01L 23/58* (2006.01)
*H01L 25/065* (2006.01)
*H01L 25/00* (2006.01)

(52) U.S. Cl.
CPC .. *H01L 21/67011* (2013.01); *H01L 21/67092* (2013.01); *H01L 21/67132* (2013.01); *H01L 21/6836* (2013.01); *H01L 21/78* (2013.01); *H01L 23/48* (2013.01); *H01L 23/481* (2013.01); *H01L 24/11* (2013.01); *H01L 24/32* (2013.01); *H01L 23/49816* (2013.01); *H01L 23/562* (2013.01); *H01L 23/585* (2013.01); *H01L 25/0657* (2013.01); *H01L 25/105* (2013.01); *H01L 25/50* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01)

(58) Field of Classification Search
CPC ... H01L 2924/01029; H01L 2924/3512; H01L 2924/00; H01L 2924/01
See application file for complete search history.

(56) References Cited

U.S. PATENT DOCUMENTS

| | | | |
|---|---|---|---|
| 8,772,137 B2 | 7/2014 | Chen et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2003/0075162 A1* | 4/2003 | Hamilton | B27B 5/32 125/13.01 |
| 2006/0189099 A1* | 8/2006 | Lu | H01L 21/78 438/460 |
| 2008/0315434 A1* | 12/2008 | McElrea | H01L 21/6835 257/777 |
| 2009/0102042 A1* | 4/2009 | Uoya | H01L 21/6835 257/690 |
| 2010/0181681 A1* | 7/2010 | Akiba | B28D 5/022 257/773 |
| 2012/0313217 A1* | 12/2012 | Hung | H01L 23/585 257/532 |
| 2014/0001616 A1* | 1/2014 | Daniels | H01L 24/97 257/676 |
| 2016/0211180 A1* | 7/2016 | Takahashi | H01L 21/6836 |

* cited by examiner

SEMICONDUCTOR DIE HAVING EDGE WITH MULTIPLE GRADIENTS AND METHOD FOR FORMING THE SAME

PRIORITY CLAIM AND CROSS-REFERENCE

This application claims the benefit of U.S. Provisional Application No. 62/433,856, filed on Dec. 14, 2016, the entirety of which is incorporated by reference herein.

BACKGROUND

Semiconductor devices are used in a variety of electronic applications, such as personal computers, cell phones, digital cameras, and other electronic equipment. The semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that take up less area than the packages of the past, in some applications.

Singulation may occur at different stages of semiconductor manufacturing. A semiconductor substrate may be singulated into individual dies after the semiconductor devices and interconnects are formed. The individual dies may be packaged separately to another semiconductor substrate that is then singulated again into a packaged chip. In some semiconductor manufacturing processes commonly referred to as wafer-level packaging, a semiconductor substrate having all of the semiconductor devices and interconnects is first packaged to another substrate before singulation. Thus, singulation may occur one or more times during semiconductor manufacturing.

Although numerous improvements to the methods of performing a sawing process have been invented, they have not been entirely satisfactory in all respects. Consequently, it would be desirable to provide a solution to improve the sawing process so as to increase the production yield of the semiconductor wafers.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
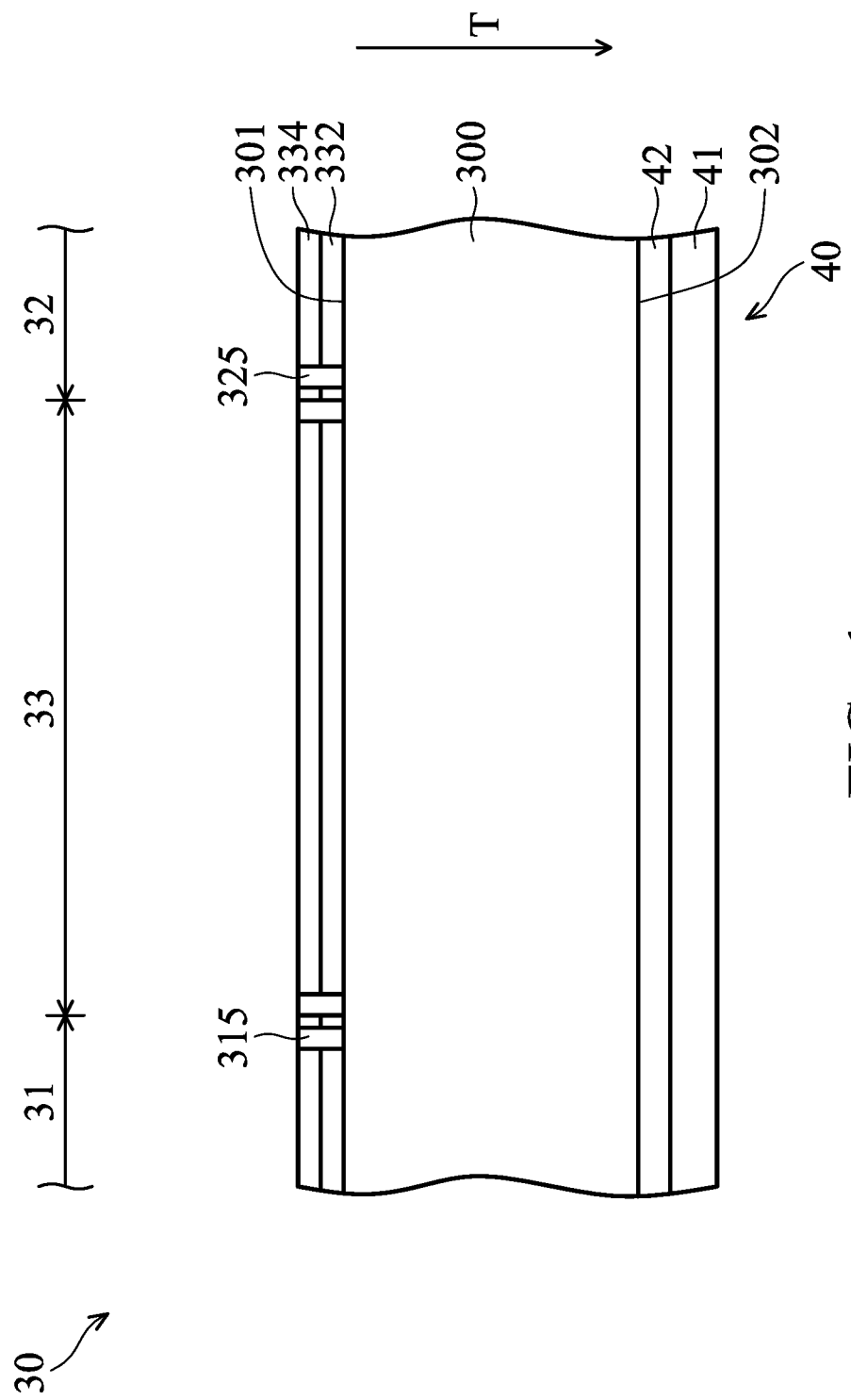
FIG. 1 shows a schematic cross-sectional view of a semiconductor wafer, in accordance with some embodiments

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

A semiconductor wafer may be simulated into individual dies in a sawing process. In the sawing process, mechanical stresses may be induced on the semiconductor wafer that can result in cracking and/or peeling at die edges, thereby compromising the integrity and reliability of semiconductor devices present on the respective die. In addition, residual stresses due to differences in the coefficient of thermal expansion (CTE) and tensile modulus (i.e., Young's modulus) between adjacent material layers of the individual semiconductor dies can result in delamination and peeling of the respective semiconductor dies during the sawing process and can lead to a decrease in product yield.

Therefore, one object of the application, in accordance with some embodiments, is to provide a method for sawing a semiconductor wafer with a die attach film (DAF) by performing sawing operations multiple times. In each sawing operation, dicing blades of different widths are used to saw at least a portion of the semiconductor wafer so as to prevent cracking and pealing during the sawing process.

FIG. 1 shows a schematic cross-sectional view of a semiconductor wafer 30, in accordance with some embodiments. In some embodiments, the semiconductor wafer 30 includes a substrate 300. The substrate 300 may be made of silicon or another semiconductor material. Alternatively or additionally, the substrate 300 may include other elementary semiconductor materials such as germanium (Ge).

In some embodiments, the substrate 300 is made of a compound semiconductor such as silicon carbide (SiC), gallium arsenic (GaAs), indium arsenide (InAs), or indium phosphide (InP). In some embodiments, the substrate 300 is made of an alloy semiconductor such as silicon germanium (SiGe), silicon germanium carbide (SiGeC), gallium arsenic phosphide (GaAsP), or gallium indium phosphide (GaInP). In some other embodiments, the substrate 300 may be a silicon-on-insulator (SOI) or a germanium-on-insulator (GOI) substrate. In some embodiments, the thickness of the substrate 300 is greater than 500 μm.

The substrate 300 has a front surface 301 and a rear surface 302 opposite to the front surface 301. A number of die regions, such as die regions 31 and 32 are defined on the front surface 301. The die regions 31 and 32 are arranged such that a scribe line region 33 is formed between the die regions 31 and 32. In some embodiments, there is no functional device formed in the scribe line region 33. In some embodiments, the scribe line region 33 is metal-free, i.e., the scribe line region 33 does not include any metal layer or structure. However, it should be appreciated that many variations and modifications can be made to embodiments of the disclosure.

In some embodiments, the semiconductor wafer 30 includes a number of material layers formed on the front surface 301 of the substrate 300. For example, the semiconductor wafer 30 includes two material layers 332 and 334. The two material layers 332 and 334 are formed on the front surface 301 of the substrate 300.

The material layer 334, the material layer 332, and the substrate 300 are arranged in order in the thickness direction T of the semiconductor wafer 30. The scribe line region 33 and at least boundary areas of the die regions 31 and 32 are covered by the two material layers 332 and 334.

The material layers 332 and 334 may include a dielectric layer (e.g., oxide layer, nitride layer, oxynitride layer, extreme low-k (ELK) dielectric layer or low-k dielectric layer) and/or a conductive layer (e.g., copper (Cu) layer, aluminum (Al) layer or aluminum copper (AlCu) layer). The two material layers 332 and 334 can be formed by a chemical vapor deposition (CVD) process, a spin-on coating process, a thermal process, or another method that is adapted to form dielectric material layers.

It should be understood that the number of material layers 332 and 334 shown in FIG. 1 is merely exemplary and the number of material layers can vary according to the semiconductor technology that is applied.

In addition to the material layers 332 and 334, a number of semiconductor devices (not shown in figures) may be formed in the die regions 31 and 32. The semiconductor devices may be, but are not limited to, transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements.

In some embodiments, the semiconductor wafer 30 also include sealing ring structures 315 and 325. The sealing ring structures 315 and 325 are disposed adjacent to boundaries between each of the die regions 31 and 32 and the scribe line region 33. The sealing ring structures 315 and 325 protects the semiconductor devices in the die regions 31 and 32 from damage such as cracks and stresses induced by dicing blades.

Still referring FIG. 1, in some embodiments, a supporting element 40 is formed on the rear surface 302 of the substrate 300 to fix the substrate 300 during the sawing process. In some embodiments, the supporting element 40 includes a dicing tape 41 and a die attach film (DAF) 42. The DAF 42 can be formed on a surface of the dicing tape 41 and the dicing tape 41 is connected to the rear surface 302 of the substrate 300 via the DAF 42.

The DAF 42 may function as an adhesive mechanism to adhere the substrate 300 to a carrier wafer (not shown in figures) in the following process. The DAF 42 may include a thermoplastic material, such as epoxy resin, phenol resin, or poly-olefin, for example. Alternatively, other thermoplastic materials or polymers compatible with semiconductor processing environments may be used. The DAF 42 may be liquid, e.g., a thick liquid, when applied, but may form a solid layer at room temperature. The DAF 42 may become semi-liquid when heated and may become sticky to function as an adhesive at elevated temperatures.

Figure 2:
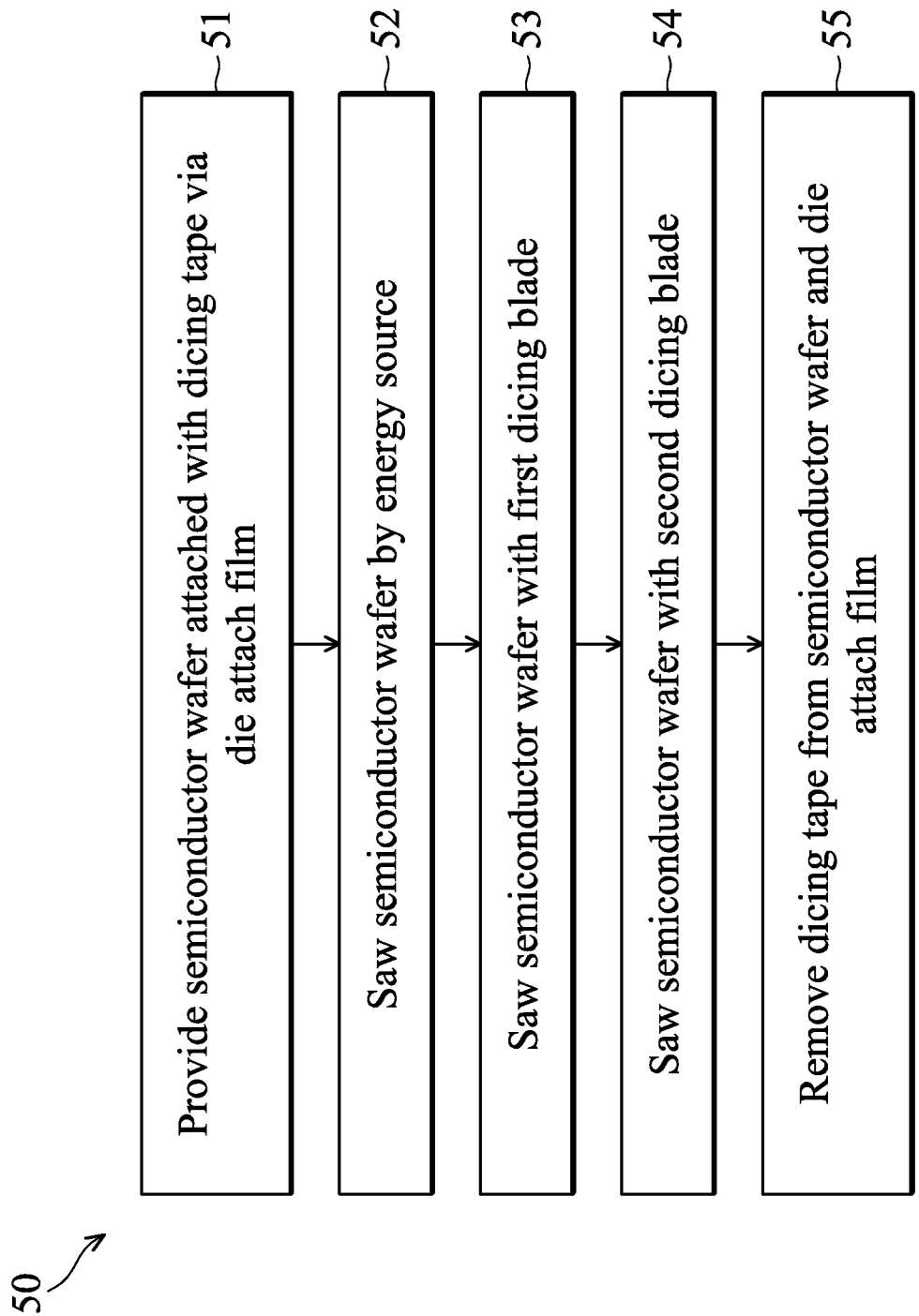
FIG. 2 shows a flow chart illustrating a method for sawing a semiconductor wafer, in accordance with some embodiments.

FIG. 2 is a flow chart illustrating a method 50 for sawing a semiconductor wafer, in accordance with some embodiments. For illustration, the flow chart will be described to accompany the schematic view shown in FIGS. 3A-3C. Some of the described stages can be replaced or eliminated in different embodiments.

The method 50 begins with operation 51, in which a semiconductor wafer, such as the semiconductor wafer 30, is provided. In some embodiments, the dicing tape 41 is connected to the rear surface 302 of the substrate 300 of the semiconductor wafer 30 via the DAF 42. The DAF 42 may be applied to the dicing tape 41 using a lamination process and may have a thickness of about 10 μm, for example. Alternatively, the DAF 42 may be applied using other techniques and may have other dimensions.

To bond the substrate 300 to the dicing tape 41, the DAF 42 is heated, after or while the substrate 300 is placed on the DAF 42. The DAF 42 may be heated at a temperature of about 150° C. to about 270° C. for about 1 second to 2 minutes, to activate the adhesive properties of the DAF 42. In other embodiments, the DAF 42 may be adapted to include a semi-liquid adhesive when the DAF 42 is heated to a temperature of about 150° C. or greater, for example. Pressure may also be applied to the DAF 42, e.g., from the substrate 300 downwardly to the dicing tape 41. The pressure on the DAF 42 may be about 1 Newton (N) or greater, for example, although other amounts of pressure may alternatively be applied.

After the substrate 300 is bonded on the dicing tape 41, various processes may be conducted to form the semiconductor devices and the material layers 332 and 334 on the front surface 301 of the substrate 300. The processes may include deposition, etching, implantation, photolithography, annealing, and/or other suitable processes.

Figure 3A:
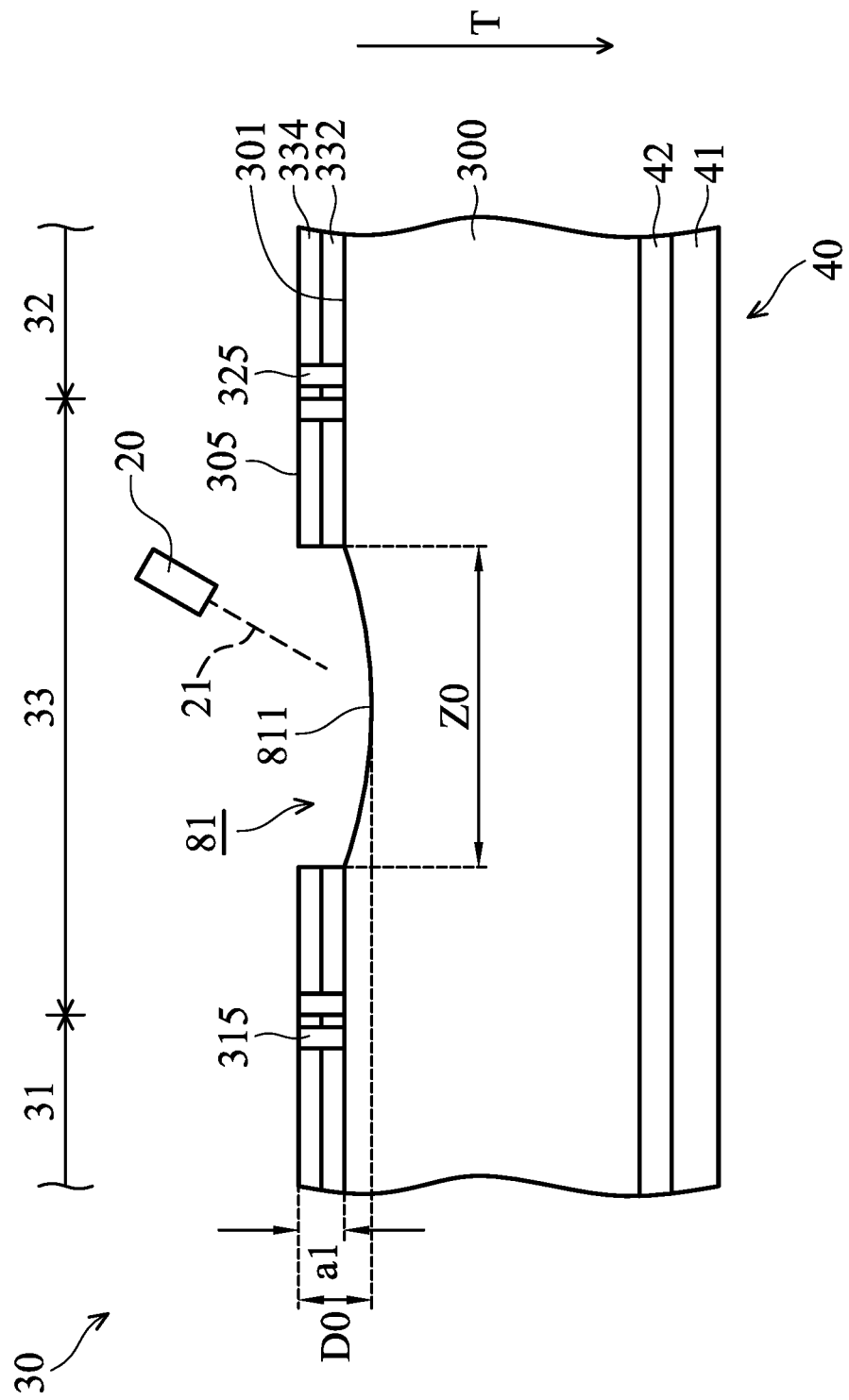
FIG. 3A shows a schematic view of one stage of a method for sawing a semiconductor wafer as the semiconductor wafer is sawed by an energy source, in accordance with some embodiments.

The method continues to operation 52 in which the semiconductor wafer 30 is sawed by an energy source 20, as shown in FIG. 3A in accordance with some embodiments. More specifically, portions of the material layers 332 and 334 are removed (e.g. sawed) to form a recess 81 exposing the substrate 300 at the scribe line region 33. In addition, the substrate 300 is also removed (e.g. sawed) by the energy source 20 in accordance with some embodiments.

In some embodiments, a depth D0 of the recess 81 is greater than a total thickness a1 of the material layers formed over the substrate 300. The thickness a1 may be defined as a distance measured from a top surface 305 of the semiconductor wafer 30 to a boundary between the substrate 300 and the material layer 332 that is immediately connected to the substrate 300. The "top surface" 305 used herein and below refers to the upper surface of the outermost material layer, such as the material layer 334, that is formed on the substrate 300 at the scribe line region 33.

In some embodiments, at least a portion of a bottom surface 811 of the recess 81 is lower than the front surface 301 of the substrate 300, as shown in FIG. 3A. As a result, the material layers 332 and 334 formed in the die regions 31 and 32 are separated from each other.

In some embodiments, the recess 81 includes a bowl-shaped cross section. The bottom surface 811 of the recess 81 is not a planar surface and includes a curved surface. In some embodiments, a spacing between the recess 81 and the sealing ring structures 315 and 325 is in a range from about 5 μm to about 15 μm. In other illustrative embodiments, the spacing is in a range from about 1 μm to about 20 μm. This spacing will typically depend upon a width of the scribe line region 33 and a width of a dicing blade which is going to be used in the subsequent process, but also may need to be large enough to provide a buffer zone allowing for misalignments and other manufacturing factors.

In some embodiments, the energy source 20 emits a focused light beam 21. The focused light beam 21 may include a focused laser light beam, a focused electron beam (e-beam) or a high-pressure water beam. In the present embodiments, a laser light beam is used, and a laser wavelength of the laser light beam may be about 355 nm, an energy of the laser light beam may be in a range from about 0.5 W to about 5 W, and a beam size of the laser light beam may be in a range from about 15 μm to about 30 μm.

Figure 3B:
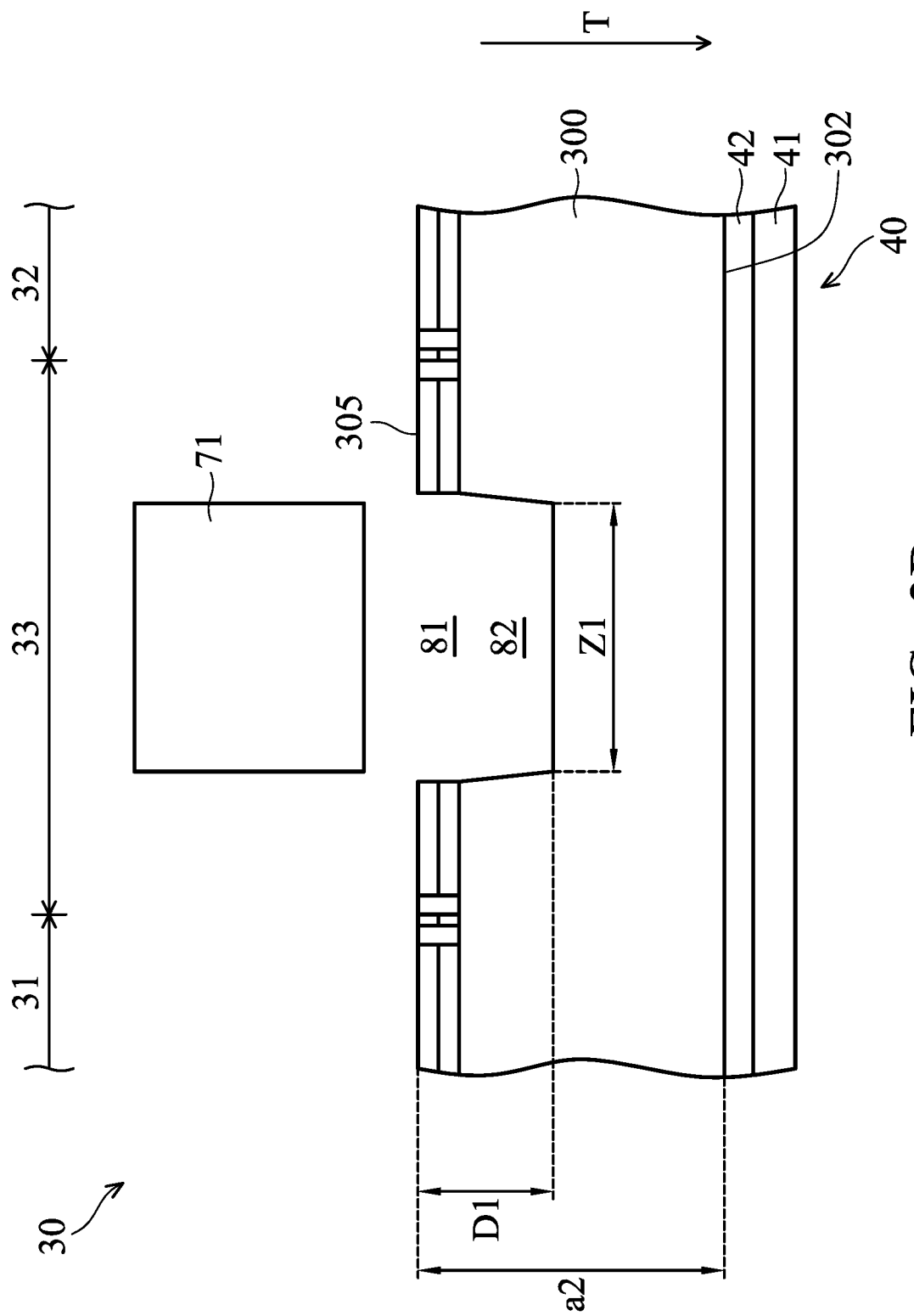
FIG. 3B shows a schematic view of one stage of a method for sawing a semiconductor wafer as an upper portion of the semiconductor wafer is sawed using a dicing blade, in accordance with some embodiments.

The method 50 continues to operation 53 in which the semiconductor wafer 30 is sawed by a first dicing blade 71 to form a first opening 82, as shown in FIG. 3B in accordance with some embodiments. More specifically, the semiconductor wafer 30 is sawed from the substrate 300 exposed by the recess 81 at the scribe line region 33, and therefore the first opening 82 is located under the recess 81. In some embodiments, the first opening 82 has a first sawing depth D1 in the semiconductor wafer 30. The first sawing depth D1 is greater than the depth D0 of the recess 81 but less than a distance a2 measured from the top surface 305 of the semiconductor wafer 30 to the rear surface 302 of the substrate 300.

The first dicing blade 71 may be moved along the recess 81 to separate an upper portion of the substrate 300 at the die region 31 and an upper portion of the substrate 300 at the die region 32. In some embodiments, a width Z1 of the first dicing blade 71 is smaller than a width Z0 of the bottom surface 811 of the recess 81. As a result, a sidewall of the recess 81 and a sidewall of the first opening 82 have different inclinations. The structural feature of the sidewall will be described in more detail with reference to FIG. 6.

The first dicing blade 71 may cut the semiconductor wafer 30 at a sawing speed in a range from about 10 μm/s to about 100 μm/s. In addition, the first dicing blade 71 may cut the semiconductor wafer 30 at a feeding speed in a range from about 10 μm/s to about 500 μm/s. The first dicing blade 71 may be any blade suitable for cutting semiconductor wafers, such as a diamond tipped saw blade, for example.

Figure 3C:
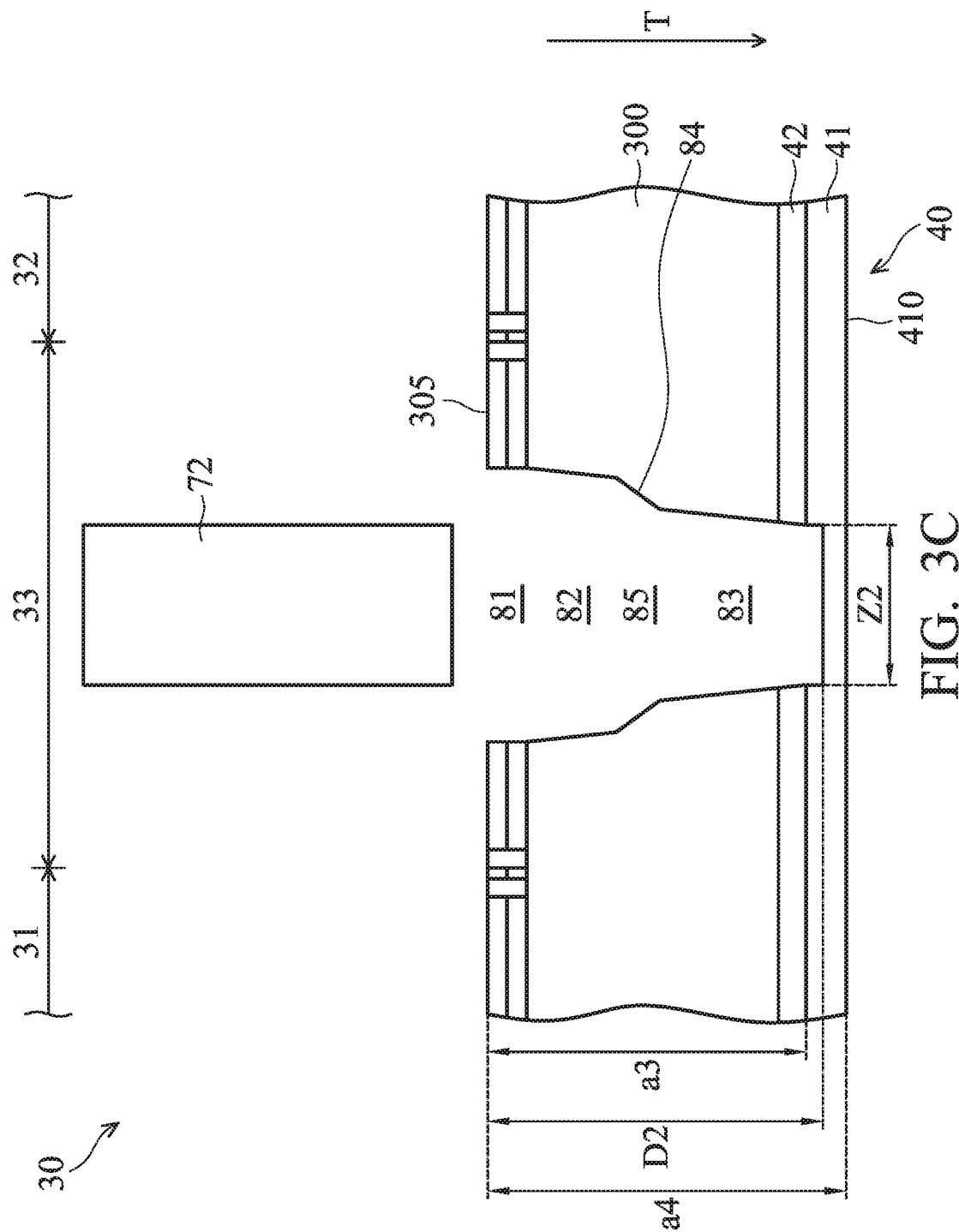
FIG. 3C shows a schematic view of one stage of a method for sawing a semiconductor wafer as the lower portion of the semiconductor wafer, a die attach film and a portion of thickness of a dicing tape is sawed using a dicing blade, in accordance with some embodiments.

The method 50 continues to operation 54 in which the semiconductor wafer 30 is sawed through by a second dicing blade 72 to form a second opening 83, as shown in FIG. 3C in accordance with some embodiments. More specifically, the semiconductor wafer 30 is sawed from the portion exposed by the first opening 82, so that the second opening 83 is located under the first opening 82.

In addition, a middle opening 85 is formed between the first opening 82 and the second opening 83 due to the sawing process using the second dicing blade 72. Therefore, a tapered structure 84 is formed at the middle opening 85. The width of the middle opening 85 gradually decreases along the thickness direction T from the first opening 82 to the second opening 83.

In some embodiments, the second opening 83 has a second sawing depth D2 in the semiconductor wafer 30. The second sawing depth D2 is greater than a distance a3 measured from the top surface 305 of the semiconductor wafer 30 to the boundary between the DAF 42 and the dicing tape 41. In addition, the second sawing depth D2 is less than a distance a4 measured from the top surface 305 of the semiconductor wafer 30 to a bottom surface 410 of the dicing tape 41. As a result, the lower portion (the portion adjacent to the rear surface 302) of the substrate 300 at the die region 31 is separated from the lower portion of the substrate 300 at the die region 32. In addition, the DAF 42 and the upper portion of the dicing tape 41 at the die region 31 are separated from the DAF 42 and the upper portion of the dicing tape 41 at the die region 32 by the third opening 83.

In some embodiments, the ratio of the first sawing depth D1 (FIG. 3B) and the second sawing depth D2 is in a range from about ½ to about ⅓, and thereby the mechanical, residual and other stresses induced on the semiconductor wafer (e.g., stress generated by DAF adhesion) are gradually reduced or balanced.

The second dicing blade 72 may be moved along the first opening 82 to separate lower portions of the substrate 300 at the die regions 31 and 32. In some embodiments, a width Z2 of the second dicing blade 72 is smaller than the width Z1 of the first dicing blade 71 (FIG. 3B).

The second dicing blade 72 may cut the semiconductor wafer 30 at a sawing speed in a range from about 10 μm/s to about 100 μm/s. In addition, the second dicing blade 72 may cut the semiconductor wafer 30 at a feeding speed in a range from about 10 μm/s to about 500 μm/s. The second dicing blade 72 may be any blade suitable for cutting semiconductor wafers, such as a diamond tipped saw blade, for example.

Figure 3D:
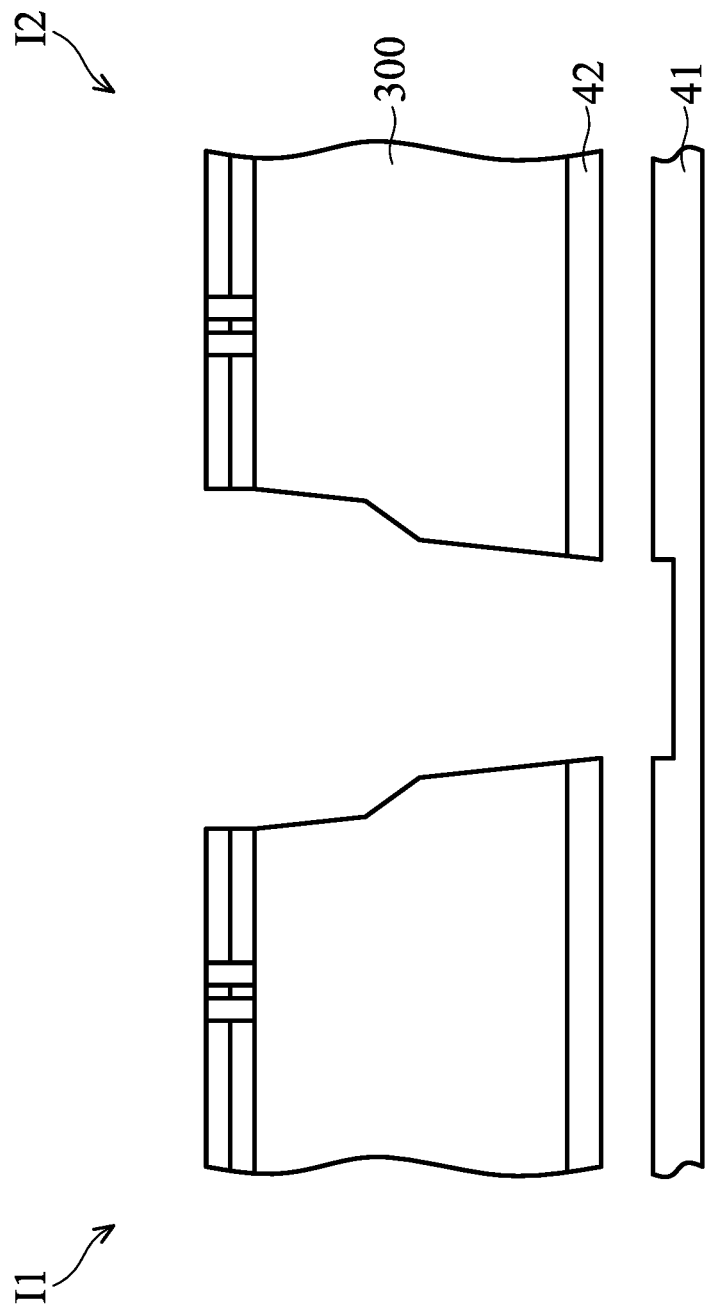
FIG. 3D shows a schematic view of one stage of a method for sawing a semiconductor wafer as dies are detached from a dicing tape, in accordance with some embodiments.

The method 50 continues to operation 55 in which the dicing tape 41 is removed from the DAF 42, as shown in FIG. 3D in accordance with some embodiments. In some embodiments, the dicing tape 41 is removed by projecting UV light on the dicing tape 41, so that the dicing tape 41 loses adhesion, and two dies I1 and I2 are released from the dicing tape 41. Afterwards, a vacuum head (not shown in figures) may then pick up DAF 41 and the dies I1 and I2 attached thereon for subsequent steps of the process.

Figure 4:
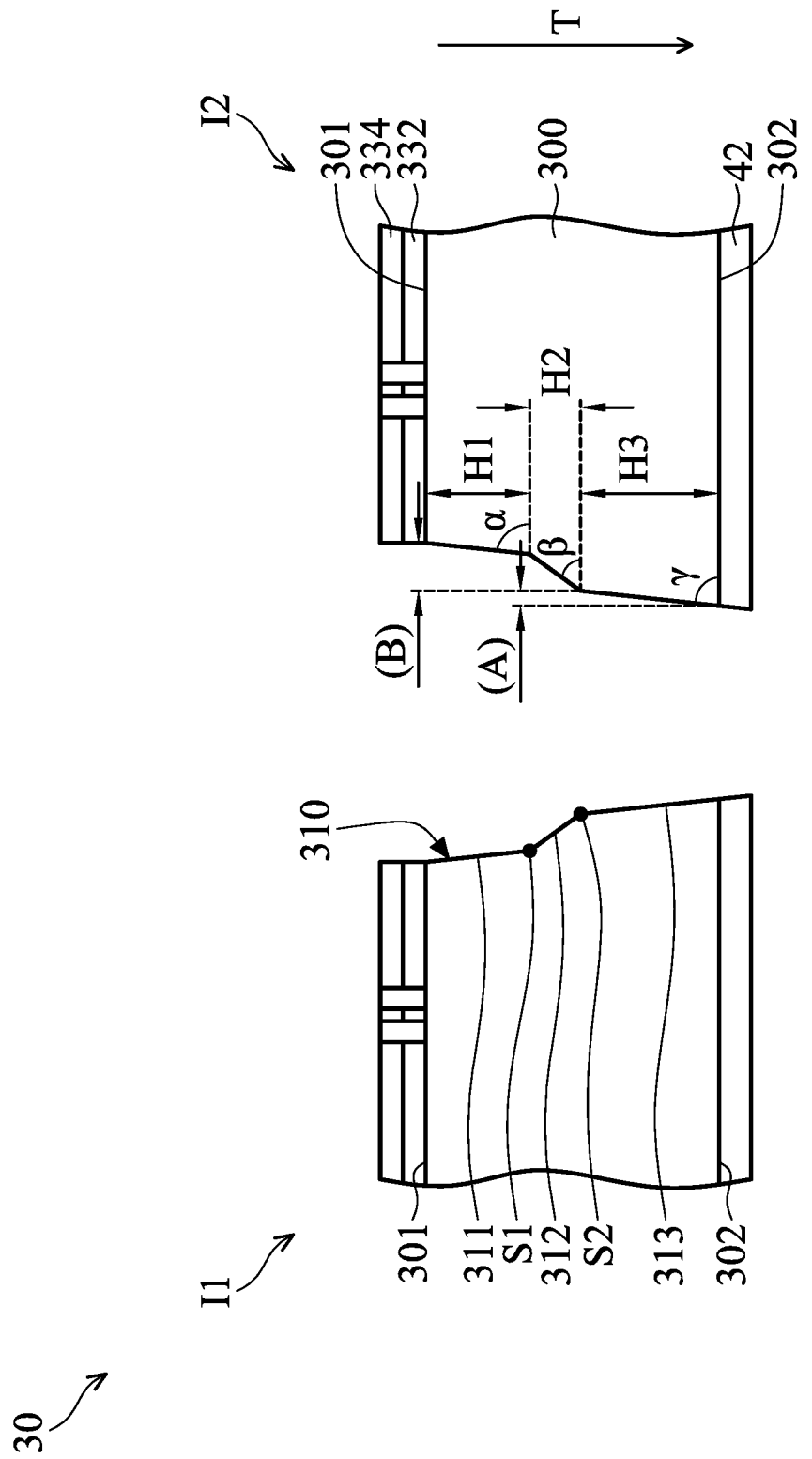
FIG. 4 shows a schematic cross-sectional drawing showing an exemplary structure of two semiconductor dies separated by a sawing process of the disclosure, in accordance with some embodiments.

FIG. 4 shows a schematic cross-sectional drawing showing an exemplary structure of the two dies I1 and I2 formed by method 50 in accordance with some embodiments. In some embodiments, sidewalls of dies I1 and I2 include a numbers of segments with different slopes (inclinations).

For example, the substrate 300 of the die I1 which is sawed through by the method shown in FIG. 3A-3D includes a first primary segment 311, a middle segment 312, and a second primary segment 313. The first primary segment 311 corresponds to the sidewall of the first opening 82 (FIG. 3A), the second primary segment 313 corresponds to the sidewall of the second opening 83 (FIG. 3B), and the middle segment 312 corresponds to the middle opening 85 (FIG. 3B). The first primary segment 311, the middle segment 312, and the second primary segment 313 are arranged in order along the thickness direction T of the substrate 300 from the front surface 301 to the rear surface 302.

The upper end of the first primary segment 311 is immediately connected to the material layer 332, and the lower end of the first primary segment 311 intersects with the middle segment 312 at a first intersection S1. The middle segment 312 connects the first primary segment 311 to the second primary segment 313. The lower end of the second primary segment 313 is immediately connected to the DAF 42, and the upper end of the second primary segment 313 intersects with the middle segment 312 at a second intersection S2. In some embodiments, an angle between the sidewall of the first primary segment and a line vertical to a top surface of the substrate is in a range from about 0 degree to about 30 degrees.

In some embodiments, the first primary segment 311 has a slope α relative to a horizontal line that is parallel to the front surface 301 of the substrate 300, and the first primary segment 311 has a height H1 in the thickness direction of the substrate 300. The slope α is less than or equal to about 90 degrees and greater than 0 degrees. The height H1 is smaller than the thickness of the substrate 300.

In some embodiments, the middle segment 312 is a flat surface with a slope β relative to a horizontal direction that is parallel to the front surface 301 of the substrate 300, and the second primary segment 313 has a slope γ relative to a horizontal direction that is parallel to the front surface 301 of the substrate 300. In some embodiments, the slope β and the slope γ are greater than about 0 degree. In some embodiments, the slope β and the slope γ are greater than about 30 degrees. In some embodiments, the slope β is smaller than the slope γ and/or the slope α. In some embodiments, the slope β, the slope γ and the slope α are all different.

In some embodiments, the slope γ is less than or equal to about 90 degrees and greater than 0 degrees, and the slope β is less than the slope α or the slope γ and greater than 0 degrees. In some embodiments, the slope γ is less than the slope α, and the slope β is less than the slope γ. In some embodiments, the slope α is in a range between the slope β and the slope γ.

In some embodiments, the middle segment 312 has a height H2 in the thickness direction T of the substrate 300, and the second primary segment 313 has a height H3 in the thickness direction T of the substrate 300. The height H2 is greater than 5 μm. In some embodiments, the height H1 of the first primary segment 311 is smaller than the height H3 of the second primary segment 313. In some embodiments, the height H1 of the first primary segment 311 is smaller than the sum of the height H2 of the middle segment 312 and the height H3 of the second primary segment 313. A ratio of the height H1 of the first primary segment 311 and the sum of the height H2 of the middle segment 312 and the height H3 of the second primary segment 313 may be in a range from about ½ to about ⅓.

In some embodiments, the upper end of the first primary segment 311 is spaced apart from the upper end of the second primary segment 313 by a step gap width (B) in a direction that is perpendicular to the thickness direction T. The step gap width (B) is greater than or equal to about 3 μm.

In some embodiments, the upper end of the second primary segment 313 is spaced apart from the lower end of the second primary segment 313 by a slant width (A) in a direction that is perpendicular to the thickness direction T. The slant width (A) is less than or equal to about 10 μm.

The DAF 42 on the dies I1 and I2 can offer the buffer of die-attach interface to prevent the stress and it also offer an adhesive layer for die attach adhesion. This structure includes the layer of the DAF 42 with dicing process or dicing multi-process. The thickness of the DAF 42 is about 10 um and is picked with the dies I1 and I2 on the target surface. In some embodiments, a portion of the sidewall 310 of the dies I1 and I2 that is immediately adjacent to the DAF 42 is covered by the DAF 42, as shown in FIG. 4. The height of the sidewall 310 that is covered by the DAF 42 may be in a range from 0 μm to about 15 μm.

Figure 5:
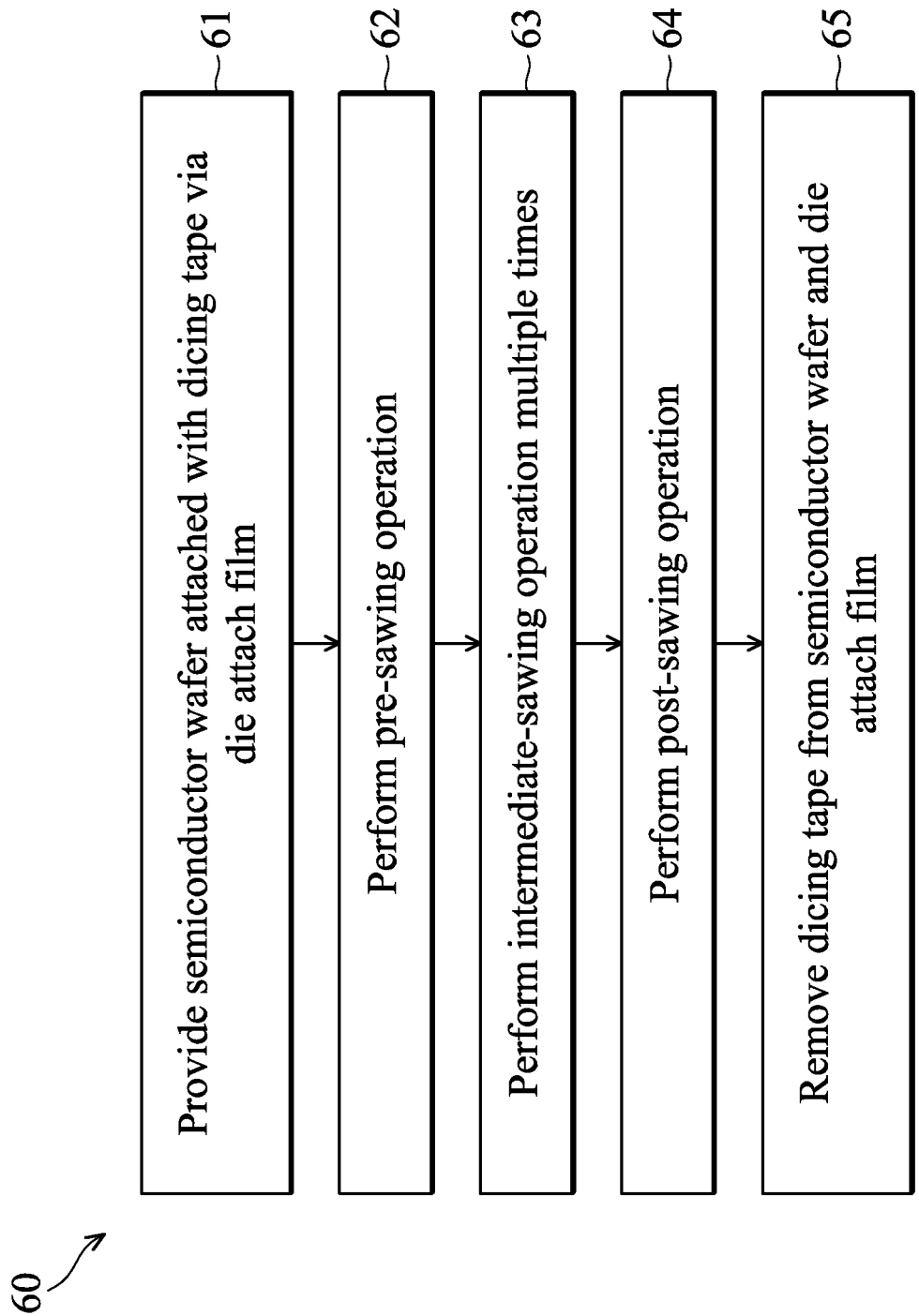
FIG. 5 shows a flow chart illustrating a method for sawing a semiconductor wafer, in accordance with some embodiments.

FIG. 5 is a flow chart illustrating a method 60 sawing a semiconductor wafer, in accordance with some embodiments. For illustration, the flow chart will be described to accompany the schematic view shown in FIGS. 6A-6D. Some of the described stages can be replaced or eliminated in different embodiments.

The method 60 begins with operation 61, in which a semiconductor wafer, such as the semiconductor wafer 30, is provided. In some embodiments, the dicing tape 41 is connected to the rear surface 302 of the substrate 300 of the semiconductor wafer 30 via the DAF 42. The DAF 42 may be applied to the dicing tape 41 using a lamination process and may include a thickness of about 10 μm, for example. Alternatively, the DAF 42 may be applied using other techniques and may have other dimensions.

To bond the substrate 300 to the dicing tape 41, heat is applied to the DAF 42, after or while the substrate 300 is placed on the DAF 42. The applied heat may be a temperature of about 150 to 270 degrees C. for about 1 second to 2 minutes, to activate the adhesive properties of the DAF 42. Pressure may also be applied to the DAF 42, e.g., from the substrate 300 downwardly to the dicing tape 41. The pressure on the DAF 42 may be about 1 Newton (N) or greater, for example, although alternatively, other amounts of pressure may also be applied.

After the bonding of the substrate 300 on the dicing tape 41, various processes may be conducted to form semiconductor devices and the material layers 332 and 334 on the front surface 301 of the substrate 300. The processes may include deposition, etching, implantation, photolithography, annealing, and/or other suitable processes.

Figure 6A:
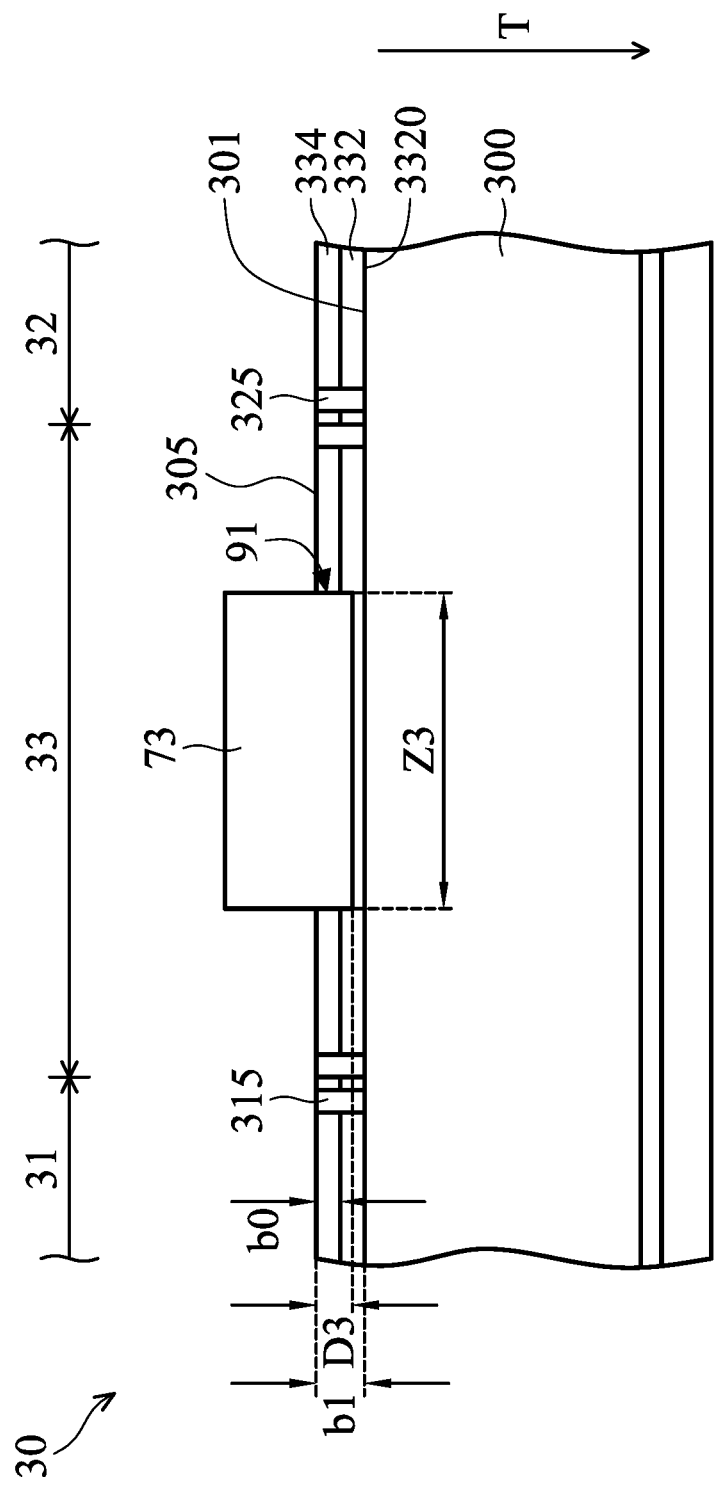
FIG. 6A shows a schematic view of one stage of a method for sawing a semiconductor wafer as a portion of thickness of a material layer is sawed using a dicing blade, in accordance with some embodiments.

The method 60 continues to operation 62 in which a pre-sawing operation is performed. In some embodiments, as shown in FIG. 6A, in the pre-sawing operation, the material layers 332 and 334 of the semiconductor wafer 30 is sawed with a first dicing blade 73 to form a first opening 91 on the semiconductor wafer 30. In some embodiments, a sawing depth D3 of the first dicing blade 73 in the semiconductor wafer 30 is greater than a thickness b0 of the material layer 334 but is less than a distance b1 from the top surface 305 of the semiconductor wafer 300 to a bottom surface 3320 of the material layer 332 that is connected to the substrate 300. As a result, the upper portion of the material layer 332 is sawed by the first dicing blade 73, and the lower portion of the material layer 332 is not separated by the first dicing blade 73.

A width Z3 of the first dicing blade 73 is selected according to the width of the scribe line region 33. In some embodiments, a spacing between the first opening 91 and the sealing ring structures 315 and 325 is preferably between about 5 μm to about 15 μm. In other illustrative embodiments, the spacing is preferably between about 1 μm to about 20 μm, for example. This spacing will typically depend upon the width of the scribe line region 33 and the width of the dicing blade which is going to be used in the subsequent process, but also may need to be large enough to provide a buffer zone allowing for misalignments and other manufacturing factors.

The method 60 continues to operation 63 in which an intermediate-sawing operation is performed at least once to form one or more openinges under the first opening 91. In the present embodiments, the intermediate-sawing operations are performed twice to form two openinges below the first opening 91. Stages for performing the intermediate-sawing operations are described below.

Figure 6B:
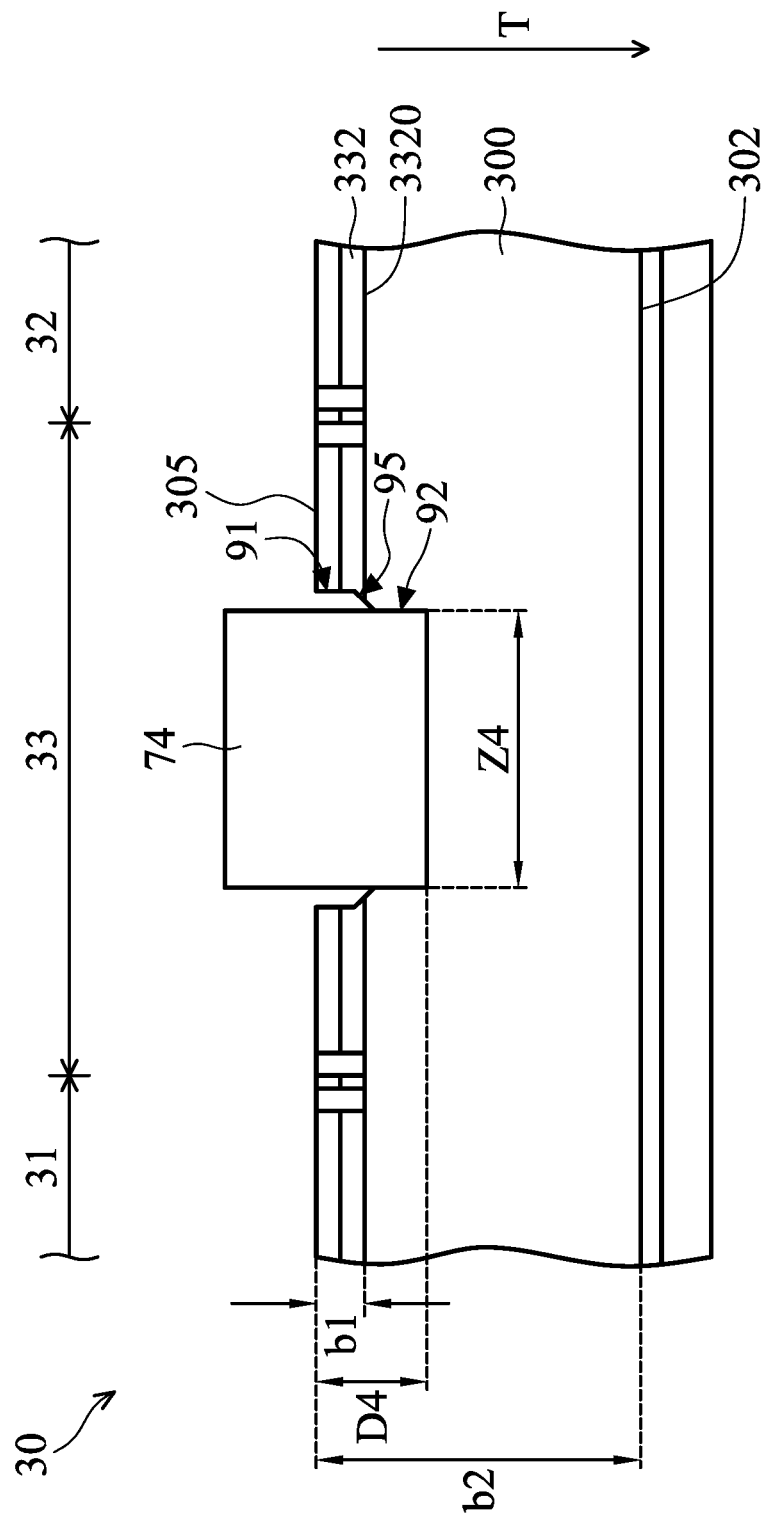
FIG. 6B shows a schematic view of one stage of a method for sawing a semiconductor wafer as a material layer and an upper portion of the semiconductor wafer is sawed using a dicing blade, in accordance with some embodiments.

In some embodiments, as shown in FIG. 6B, a second opening 92 is formed with a second dicing blade 74 with a second sawing depth D4 in the semiconductor wafer 30. The second sawing depth D4 is greater than the distance b1 from the top surface 305 of the semiconductor wafer 30 to the bottom surface 3320 of the material layer 332 that is connected to the substrate 300. In addition, the second sawing depth D4 is less than a distance b2 between the top surface 305 of the semiconductor wafer 30 to the rear surface 302 of the substrate 300. As a result, the second dicing blade 74 penetrates the boundary between the material layer 332 and the substrate 300, and the upper portion (the portion adjacent to the front surface 301) of the substrate 300 is separated by the second dicing blade 74.

It should be noted that, since a portion of the thickness of the material layer 332 is removed in the pre-sawing operation, cracking of the material layer 332 caused by operation 63 can be effectively reduced or prevented.

In some embodiments, the second dicing blade 74 is moved along the first opening 91. A width Z4 of the second dicing blade 74 is smaller than the width Z3 of the first dicing blade 73 (FIG. 6A) (i.e., the bottom width of the first opening 91). As a result, a tapered structure 95 is formed between the first opening 91 and the second opening 92. A width of the tapered structure 95 gradually decreases along the thickness direction T from the first opening 91 and the second opening 92.

Figure 6C:
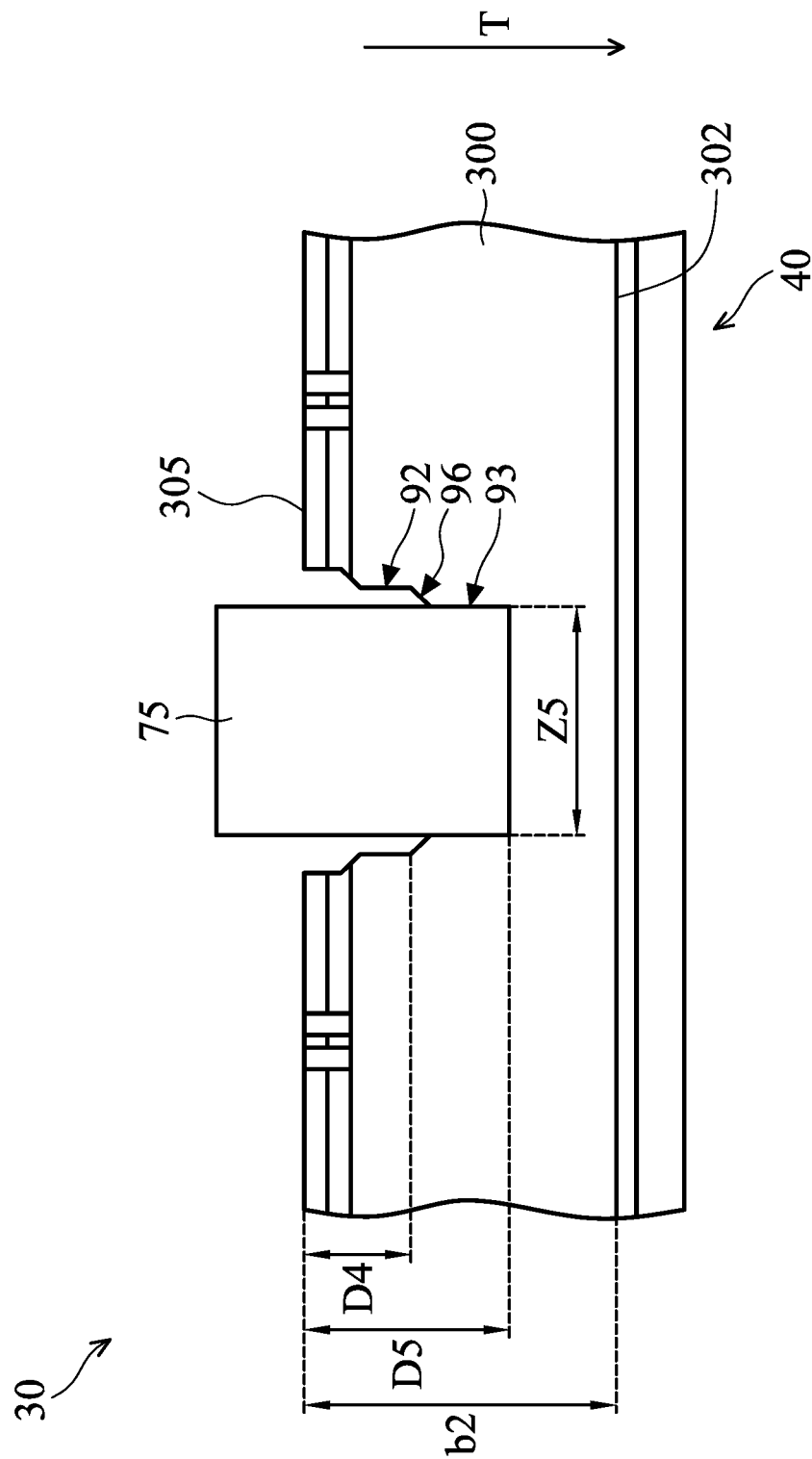
FIG. 6C shows a schematic view of one stage of a method for sawing a semiconductor wafer as a middle portion of the semiconductor wafer is sawed using a dicing blade, in accordance with some embodiments.

After the second opening 92 is formed, as shown in FIG. 6C, a third opening 93 is formed by a third dicing blade 75 with a third sawing depth D5 in the semiconductor wafer 30.

The third sawing depth D5 is greater than the second sawing depth D4. In addition, the third sawing depth D5 is less than the distance b2 between the top surface 305 of the semiconductor wafer 30 to the rear surface 302 of the substrate 300. As a result, the third dicing blade 75 does not penetrate the boundary between the substrate 300 and the supporting layer 40, and the middle portion of the substrate 300 is separated by the third dicing blade 75.

In some embodiments, the third dicing blade 75 is moved along the second opening 92. A width Z5 of the third dicing blade 75 is smaller than the width Z4 of the second dicing blade 74 (FIG. 6B) (i.e., the bottom width of the second opening 92). As a result, a tapered structure 96 is formed between the second opening 92 and the third opening 93. A width of the tapered structure 96 gradually decreases along the thickness direction T from the second opening 92 and the third opening 93. In some embodiments, the depth of the tapered structure 96 along the thickness direction T is greater than 5 μm.

Figure 6D:
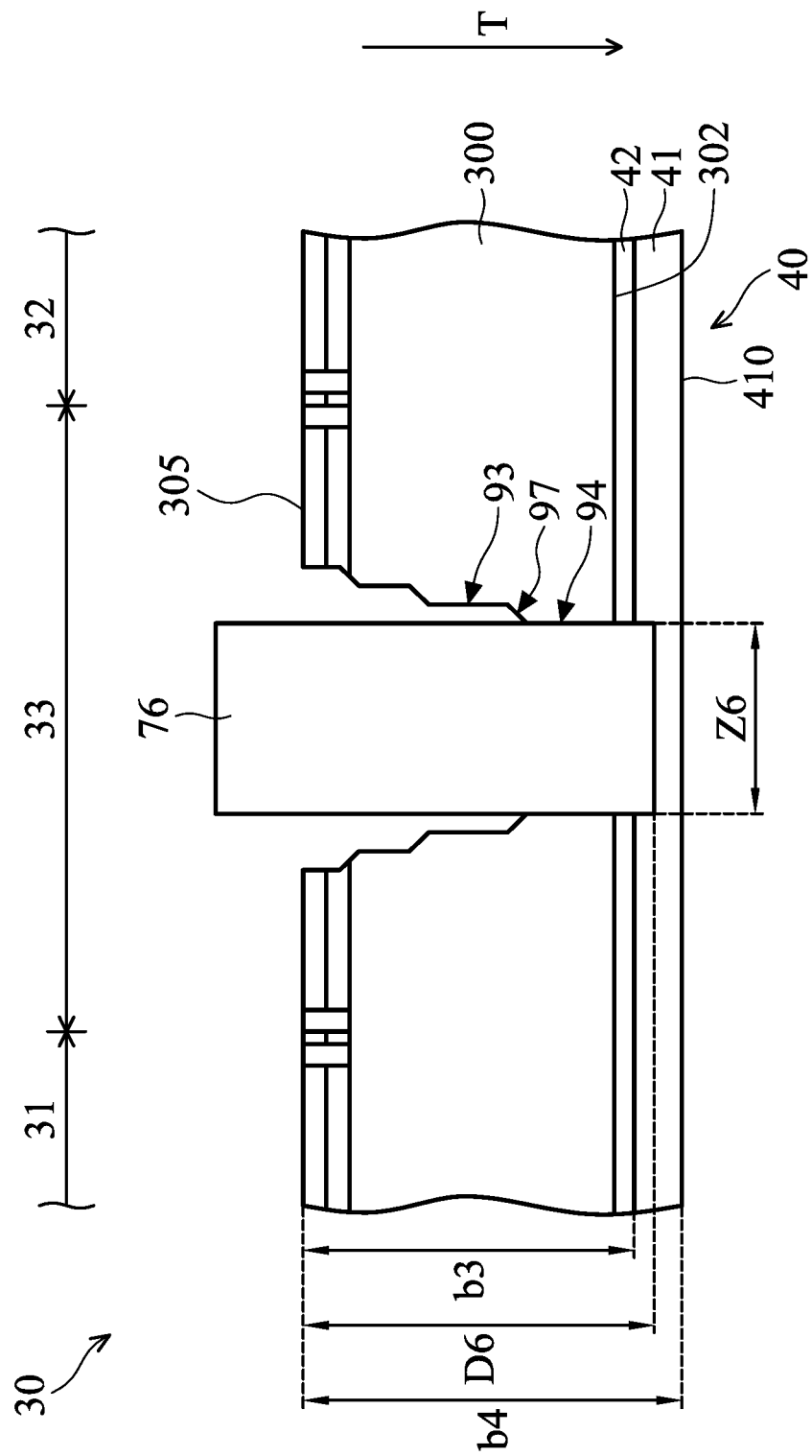
FIG. 6D shows a schematic view of one stage of a method for sawing a semiconductor wafer as the lower portion of the semiconductor wafer, a die attach film and a portion of thickness of a dicing tape is sawed using a dicing blade, in accordance with some embodiments.

The method 60 continues to operation 64 in which a post-sawing operation is performed. In some embodiments, as shown in FIG. 6D, in the post-sawing operation the semiconductor wafer 30 is sawed by a fourth dicing blade 76 to form a fourth opening 94 on the semiconductor wafer 30.

In some embodiments, a sawing depth D6 of the fourth dicing blade 76 in the semiconductor wafer 30 is greater than a distance b3 from the top surface 305 of the semiconductor wafer 30 to the boundary between the DAF 42 and the dicing tape 41. In addition, a sawing depth D6 is less than a distance b4 between the top surface 305 of the semiconductor wafer 30 to a bottom surface 410 of the supporting element 40. As a result, the fourth dicing blade 76 penetrates the lower portion of the substrate 300 and the DAF 42, and the upper portion of the dicing tape 41 is separated by the fourth dicing blade 76.

In some embodiments, the fourth dicing blade 76 is moved along the third opening 93. A width Z6 of the fourth dicing blade 76 is smaller than the width Z5 of the third dicing blade 75 (FIG. 6C) (i.e., the bottom width of the third opening 93). As a result, a tapered structure 97 is formed between the third opening 93 and the fourth opening 94. A width of the tapered structure 97 gradually decreases along the thickness direction T from the third opening 93 to the fourth opening 94.

Figure 6E:
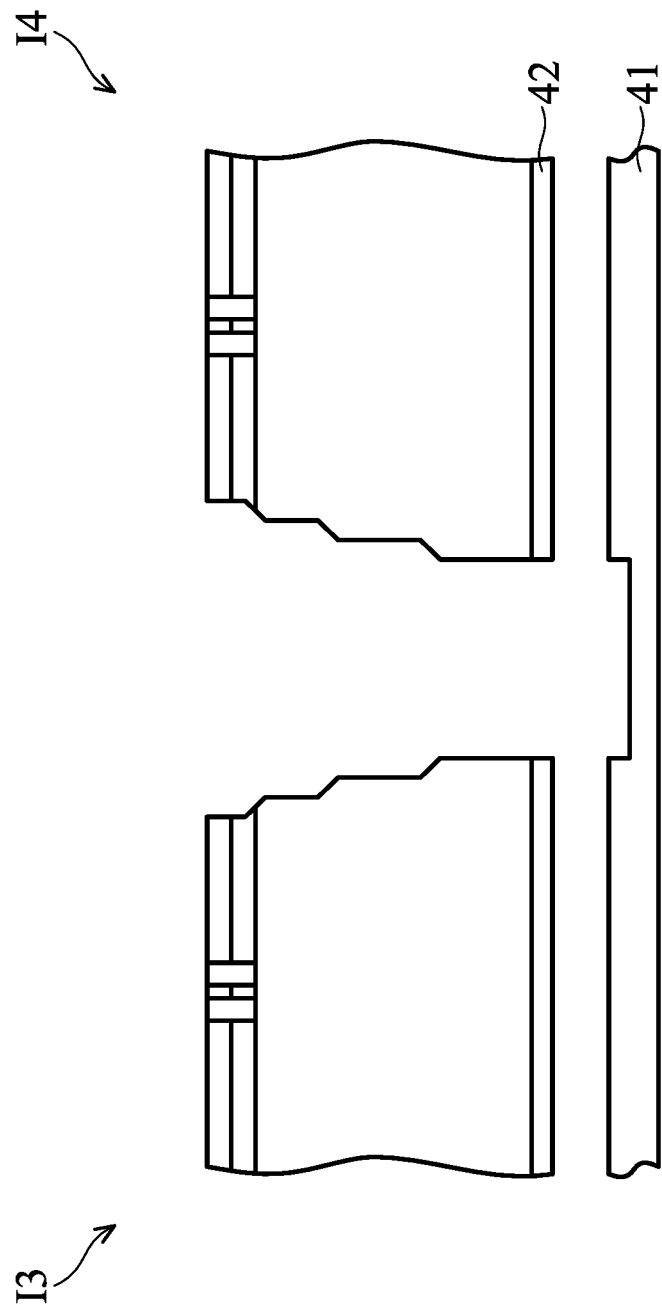
FIG. 6E shows a schematic view of one stage of a method for sawing a semiconductor wafer as dies are detached from a dicing tape, in accordance with some embodiments.

The method 60 continues to operation 65 in which the dicing tape 41 is removed from the DAF 42, as shown in FIG. 6E. In some embodiments, the dicing tape 41 is removed by projecting UV light on the dicing tape 41, so that the dicing tape 41 loses adhesion, and two dies 13 and 14 are released from the dicing tape 41. Afterwards, a vacuum head (not shown in figures) may then pick up DAF 41 and the semiconductor dies 13 and 14 attached thereon for subsequent steps of the process.

FIGS. 7A-7E illustrate cross sectional views of an integrated fan-out package 500 at various manufacturing stages, in accordance with various embodiments of the present disclosure.

Figure 7A:
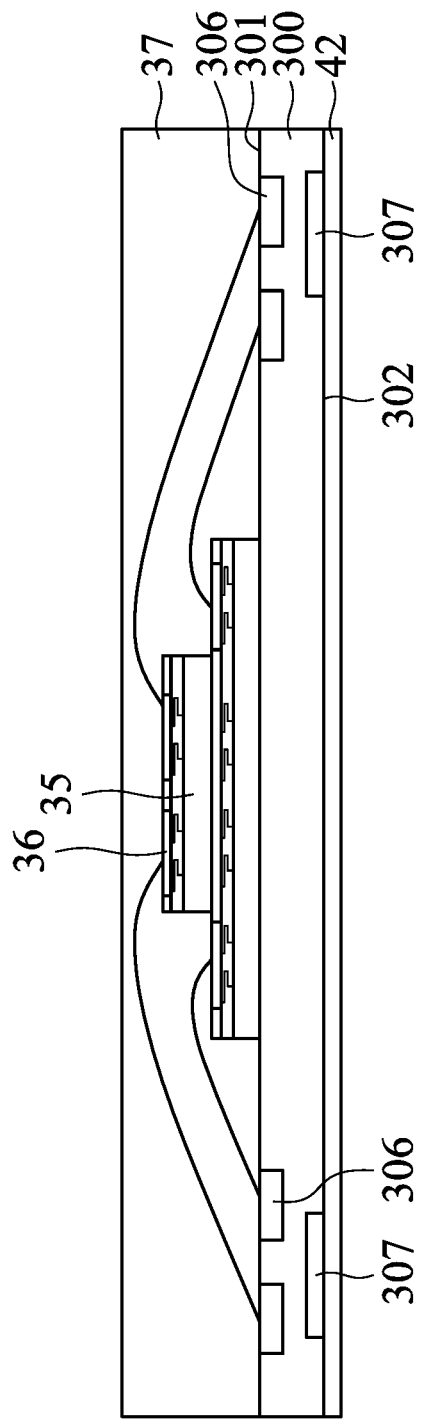
FIGS. 7A-7E illustrate cross sectional views of an integrated Fan-out (InFO) package at various manufacturing stages, in accordance with various embodiments of the present disclosure.

The method for manufacturing the integrated fan-out (InFO) package includes providing a number of singulated semiconductor die, such as a die I1. In some embodiments, as shown in FIG. 7A, the die I1 has a semiconductor device 35 mounted on the upper surface 301 of the substrate 300. An upper molding layer 37 may be formed on the front surface 301 of substrate 300 to encapsulate semiconductor device 35.

The substrate 300 includes interconnect structures (not shown). The interconnect structures connect to contact pads 306, which are bonded to semiconductor device 35, and contact pads 307 on the rear surface 302 of substrate 300, which are bonded to external connectors (which will be illustrated later), in accordance with some embodiments. Contact pads 36 of the semiconductor device 35 are connected to the contact pads 306 on the upper surface 301 of the substrate 300, using suitable methods known in the art, such as bonding wires, bumps, ball grid array (BGA) balls, in some embodiments.

Figure 7B:
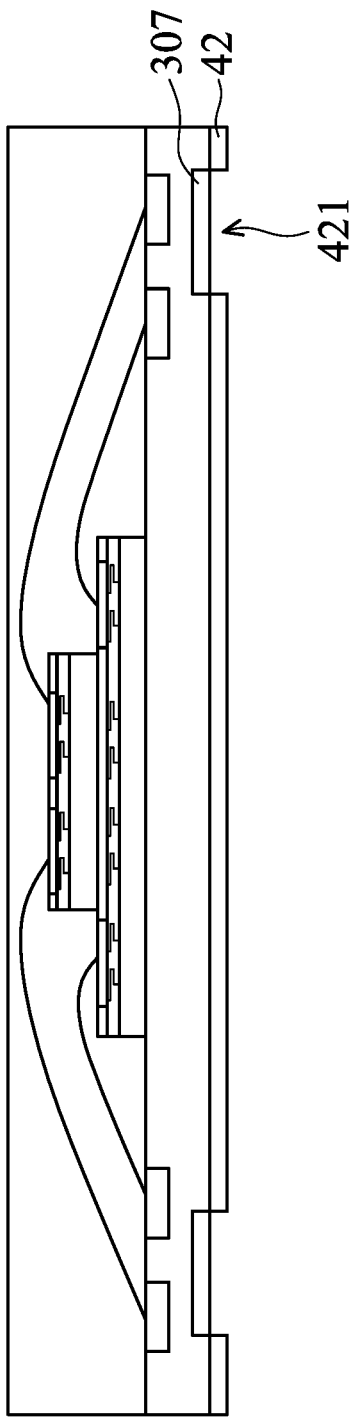

In some embodiments, after singulation process of the die I1, the DAF 42 is then patterned to expose a bottom surface of contact pads 307, as shown in FIG. 7B. The openings 421 in the DAF 42 may be formed using a lithography process or a direct patterning method, as examples. Alternatively, a laser drilling may be used to form openings 421 through the DAF 42 to expose the top surfaces of contact pads 307.

Figure 7C:
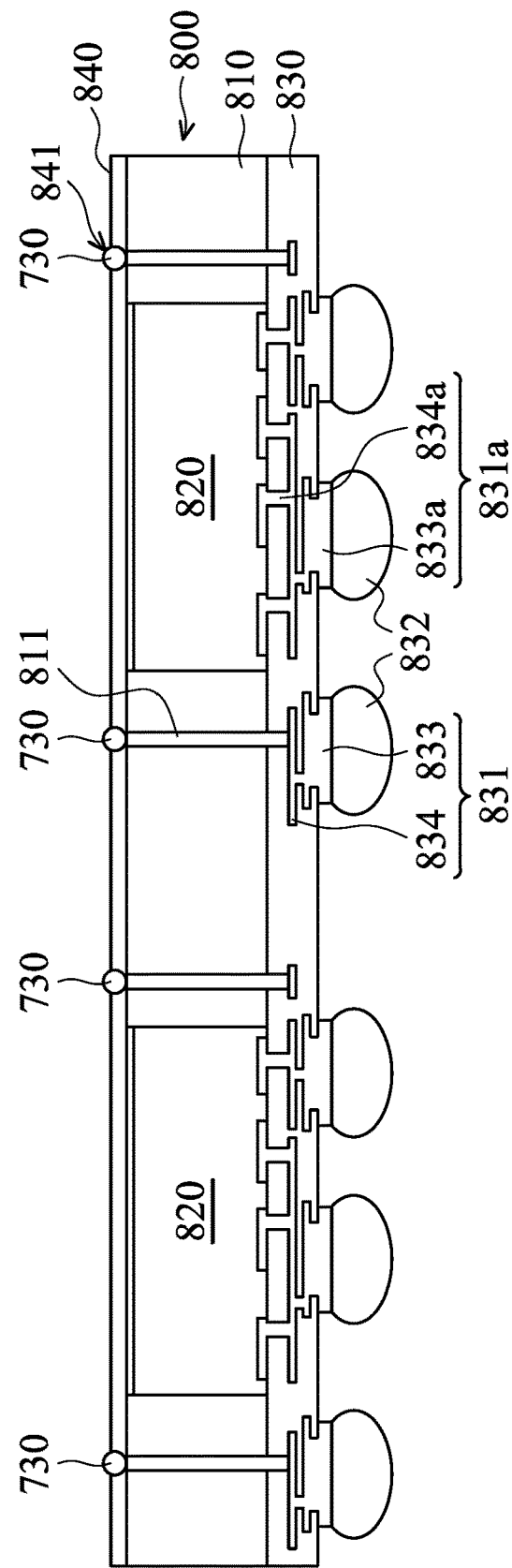

The method for manufacturing the integrated Fan-out package 500 further includes providing a bottom package 800, as shown in FIG. 7C. In some embodiments, the bottom package 800 includes a molding material 810, a number of through-vias 811, a number of semiconductor devices 820, a redistribution layer (RDL) 830 and a protective film 840. In some embodiments, the semiconductor devices 820 are semiconductor dies formed from dicing a semiconductor wafer. In some embodiments, the formation of the semiconductor devices 820 includes using the dicing process shown in FIGS. 2 and 5, and therefore sidewalls of the semiconductor devices 820 have different slopes at different portions. Accordingly, risk of cracking during dicing the semiconductor wafer may be reduced.

The molding material 810 encapsulates the semiconductor devices 820 and the through-vias 811. The RDL 830 is formed over the semiconductor devices 820, the molding material 810, and top surfaces of the through-vias 811. The RDL 830 includes one or more dielectric layers, and a number of conductive metal lines 833/833a and/or a number of of conductive metal vias 834/834a formed inside the dielectric layers 830. The conductive metal lines 833/833a and the metal vias 834/834a form interconnector structures 831/831a. Fan-out interconnect structures 832 are connected to through-vias 811 to provide easy access to electrical connection proximate back sides of semiconductor devices 820.

The dielectric layers 830 may be formed, for example, of a low dielectric constant (low-K) dielectric material, such as phosphosilicate glass (PSG), borophosphosilicate glass (BPSG), fluorinated silicate glass (FSG), SiOxCy, spin-on-glass, spin-on-polymers, silicon carbon material, compounds thereof, composites thereof, combinations thereof, or the like, by any suitable method, such as spinning, CVD, and/or plasma-enhanced CVD (PECVD).

The conductive lines 833/833a and the conductive vias 834/834a may include copper, copper alloys, other metals or alloys, or combinations or multiple layers thereof, as examples. The conductive lines 833/833a and the conductive vias 834/834a may be formed using subtractive and/or damascene techniques, as examples. The conductive lines 833/833a and the conductive vias 834/834a may be formed using one or more sputtering processes, photolithography processes, plating processes, and photoresist strip processes, as examples. Other methods can also be used to form the interconnect structures 831/831a. The contact pads 832 may include under-ball metallization (UBM) structures in some embodiments that are arranged in a ball grid array (BGA) or other patterns or arrangements.

The protective film 840 is formed on a front surface of the insulation layer 810. The protective film 840 may include a back side lamination film. The protective film 840 includes about 1 μm to about 80 μm of a lamination coating (LC) tape or a DAF, as examples. The protective film 840 is formed using a laminating process in some embodiments. The protective film 840 may also include other materials, dimensions, and formation methods. In some embodiments, the protective film 840 is not included.

Figure 7D:
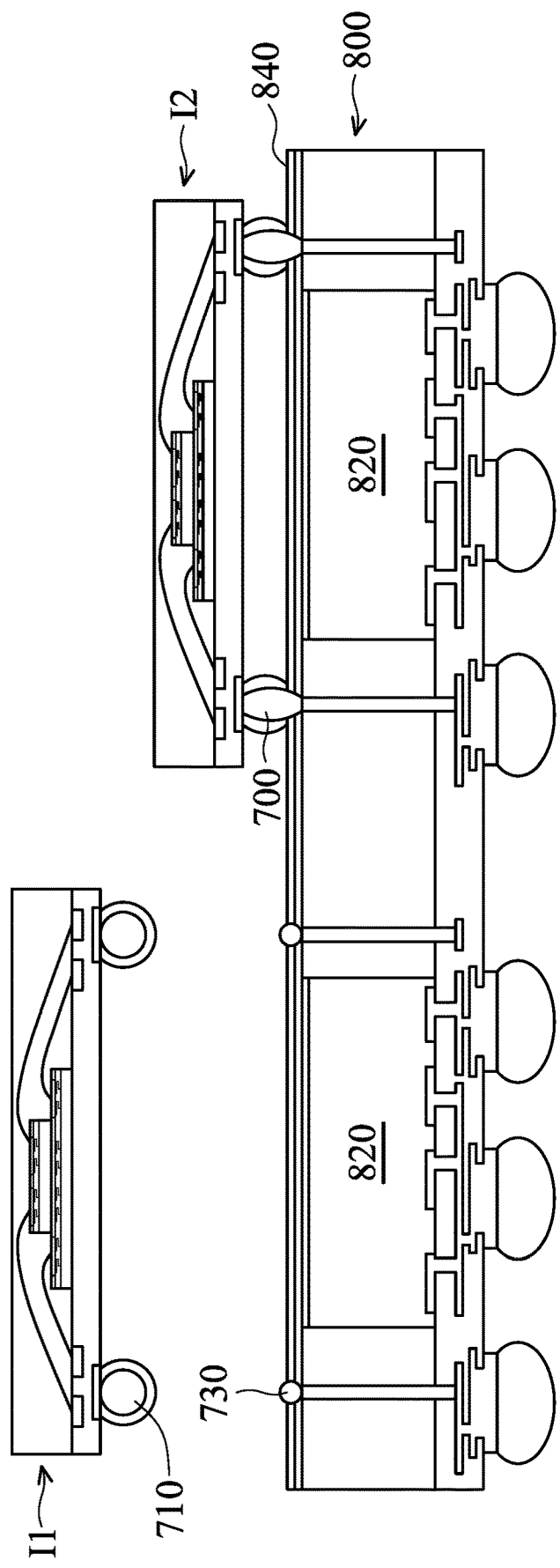

The method for manufacturing the integrated Fan-out package further includes connecting the bottom package 800 with a number of dies, such as dies I1 and I2, as shown in FIG. 7D.

In some embodiments, the dies I1 and I2 are aligned with bottom packages 800 so that locations of external connectors 710 connected to the dies I1 and I2 match those of solder paste 730 on bottom packages 800. After the semiconductor dies 31 are stacked on bottom packages 80, a reflow process may perform to form inter-package connector 700 by curing the external connectors 710 and the solder paste 730. The reflow process may be performed in a commercial reflow oven and may include preheat, thermal soak, reflow, and cooling stages. The temperature of the reflow may be determined by the composition of the external connectors 710, the solder paste 730, the particular InFO structure, and materials used in the InFO package. In accordance with some embodiments, the reflow temperature ramps from room temperature to about 270° C. Other temperature profiles are also possible.

Figure 7E:
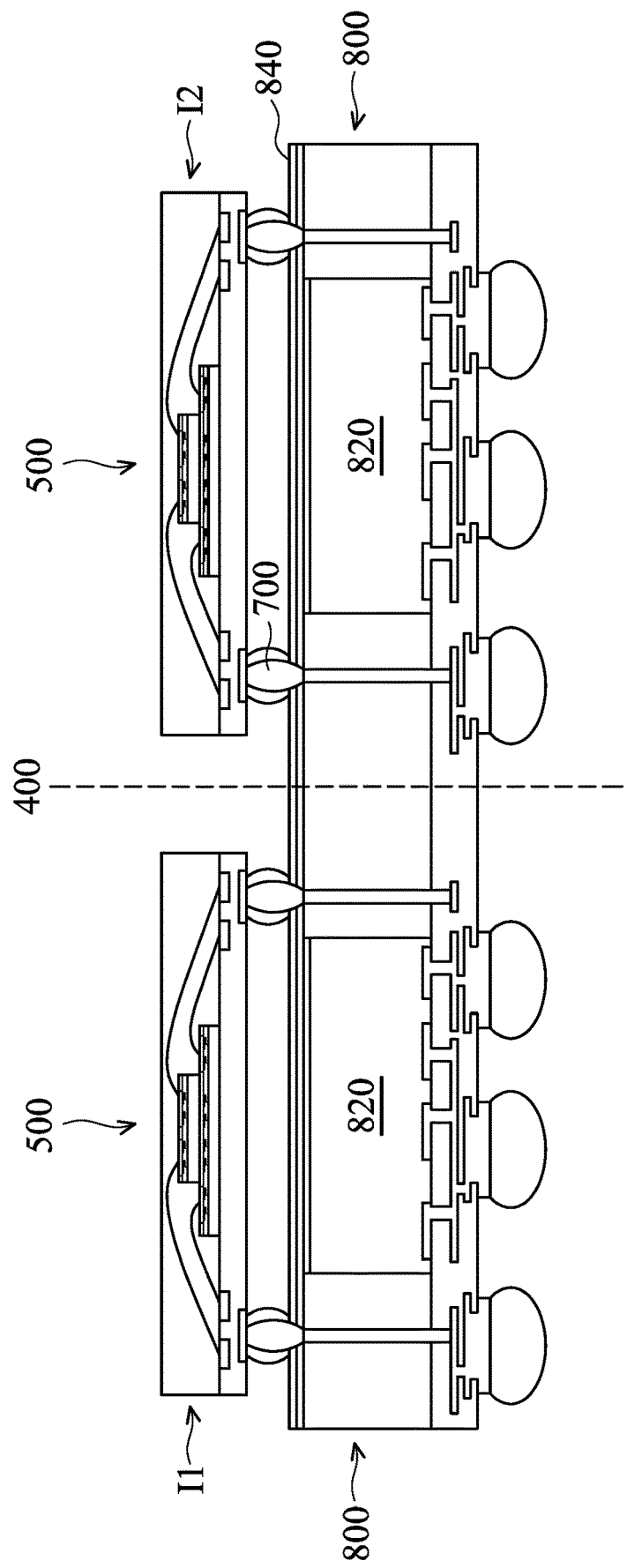

The next step after the die I1 and I2 stacking and reflow process is a dicing process to form individual InFO packages 500. The dicing process starts from a semiconductor die side and goes down to a bottom package side along a boundary 400, as shown in FIG. 7E, between two adjacent InFO packages 500. Afterwards, individual InFO packages 500 are formed. In the dicing process to form individual InFO packages 500, the method 50 or 60 described in FIG. 2 or FIG. 5 can be implemented, so the cracking at edge of the InFO package 500 can be prevented.

Embodiments of methods for sawing semiconductor wafer with a DAF formed thereon are provided. The semiconductor wafer is subjected to multiple sawing processes, and a partial depth of the semiconductor wafer is separated in the respective sawing processes. Since the mechanical, residual, and other stresses induced on the semiconductor wafer (e.g., stress generated by DAF adhesion) are gradually reduced or balanced during the sawing process, damage such as chipping, peeling, shearing, or cracking during subsequent manufacturing and testing steps can be prevented. Therefore, integrity and reliability of semiconductor devices present on the respective semiconductor die are improved.

In some embodiments, a method for sawing a semiconductor wafer is provided. The method includes sawing a semiconductor wafer to form a first opening. In addition, the semiconductor wafer includes a dicing tape and a substrate attached to the dicing tape by a die attach film (DAF), and the first opening is formed in an upper portion of the substrate. The method further includes sawing through the substrate and the DAF of the semiconductor wafer from the first opening to form a middle opening under the first opening and a second opening under the middle opening, so that the semiconductor wafer is divided into two dies. In addition, a slope of a sidewall of the middle opening is different from slopes of sidewalls of the first opening and the second opening.

In some embodiments, a method for sawing a semiconductor wafer is provided. The method includes forming a first opening in a semiconductor wafer. In addition, the semiconductor wafer includes a dicing tape, a substrate attached to the dicing tape by a die attach film (DAF), and a material layer formed over the substrate. Furthermore, the first opening is formed in an upper portion of the substrate. The method further includes forming middle opening under the first opening and a second opening under the middle opening to divided the semiconductor wafer into two dies. In addition, a sidewall of the first opening and a sidewall of the middle opening have different slopes.

In some embodiments, a semiconductor die is provided. The semiconductor die includes a die attach film (DAF), a substrate having a first primary segment, a middle segment, and a second primary segment disposed on the DAF, and a material layer formed on a top surface of the substrate. In addition, a slope of a sidewall of the middle segment is different from slopes of sidewalls of the first primary segment and the second primary segment, and a height of the first primary segment is smaller than a height of the second primary segment.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for sawing a semiconductor wafer, comprising:
    sawing a semiconductor wafer to form a first opening, wherein the semiconductor wafer comprises a dicing tape and a substrate attached to the dicing tape by a die attach film (DAF), and the first opening is formed in an upper portion of the substrate; and
    sawing through the substrate and the DAF of the semiconductor wafer from the first opening to form a middle opening under the first opening and a second opening under the middle opening, so that the semiconductor wafer is divided into two dies,
    wherein a slope of a sidewall of the middle opening is different from slopes of sidewalls of the first opening and the second opening, and wherein the slope of the sidewall of the second opening is less than the slope of the sidewall of the first opening, and the slope of the sidewall of the middle opening is less than the slope of the sidewall of the second opening.

2. The method as claimed in claim 1, further comprising: removing the dicing tape from the DAF.

3. The method as claimed in claim 1, wherein the first opening is formed by sawing the upper portion of the substrate by a first dicing blade, and the second opening is formed by sawing a bottom portion of the substrate and the DAF by a second dicing blade.

4. The method as claimed in claim 3, wherein a top portion of the dicing tape is also sawed by the second dicing blade.

5. The method as claimed in claim 3, wherein a width of the second dicing blade is less than a width of the first dicing blade.

6. The method as claimed in claim 1, further comprising;
    forming a material layer over the substrate before the first opening is formed; and
    forming a recess in the material layer to expose the substrate by an energy source.

7. The method as claimed in claim 6, wherein a sealing ring structure is formed in the material layer.

8. The method as claimed in claim 6, wherein a top portion of the substrate is sawed by the energy source when the recess is formed.

9. The method as claimed in claim 1, wherein a height of the first opening is smaller than a height of the second opening.

10. A method for sawing semiconductor wafer, comprising:
    forming a first opening in a semiconductor wafer, wherein the semiconductor wafer comprises:
    a dicing tape;
    a substrate attached to the dicing tape by a die attach film (DAF); and
    a material layer formed over the substrate,
    wherein the first opening is formed in an upper portion of the substrate; and
    forming middle opening under the first opening and a second opening under the middle opening to divide the semiconductor wafer into two dies,
    wherein a sidewall of the first opening and a sidewall of the middle opening have different slopes, and wherein a slope of the sidewall of the second opening is less than the slope of the sidewall of the first opening, and the slope of the sidewall of the middle opening is less than the slope of the sidewall of the second opening.

11. The method as claimed in claim 10, wherein a width of the first opening is greater than a width of the second opening, and a width of the middle opening reduces gradually from an end closer to the first opening to an end closer to the second opening.

12. The method as claimed in claim 10, wherein the first opening is formed by sawing the upper portion of the substrate by a first dicing blade, and the middle opening and the second opening are formed by sawing the bottom portion of the substrate and the DAF by a second dicing blade.

13. The method as claimed in claim 12, wherein a height of the first opening is smaller than a sum of a height of the second opening and a height of the middle opening.

14. The method as claimed in claim 10, wherein the second opening extends into the dicing tape.

15. The method as claimed in claim 14, further comprising:
removing the dicing tape from the DAF.

16. The method as claimed in claim 10, further comprising:
sawing the material layer and the substrate by an energy source to form a recess before the first opening is formed.

17. A method for sawing a semiconductor wafer, comprising:
forming a first opening in a substrate of a semiconductor wafer by a first dicing blade; and
forming a tapered structure under the first opening and a second opening under the tapered structure by a second dicing blade to divide the semiconductor wafer into two dies,
wherein a bottom width of the second opening is smaller than a bottom width of the first opening; and
wherein a sidewall of the first opening has a first slope, a sidewall of the second opening has a second slope less than the first slope, and a sidewall of the tapered structure has a third slope less than the second slope.

18. The method as claimed in claim 17, wherein the semiconductor wafer comprises a dicing tape attached to the substrate by a die attach film (DAF), and wherein a bottom of the second opening is in the dicing tape.

19. The method as claimed in claim 17, wherein the semiconductor wafer further comprises a material layer over the substrate and the method further comprises forming a recess in the material layer by an energy source prior to the formation of the first opening, wherein the first opening is under the recess and the bottom width of the first opening is smaller than a width of the recess.

20. The method as claimed in claim 17, wherein the first opening has a first height in a thickness direction of the substrate and the second opening has a second height in the thickness direction of the substrate and greater than the first height.

* * * * *